United States Patent
Isa et al.

(10) Patent No.: US 7,956,470 B2
(45) Date of Patent: Jun. 7, 2011

(54) SEMICONDUCTOR DEVICE

(75) Inventors: Satoshi Isa, Tokyo (JP); Mitsuaki Katagiri, Tokyo (JP); Toru Chonan, Tokyo (JP); Shigeyuki Nakazawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 984 days.

(21) Appl. No.: 11/535,750

(22) Filed: Sep. 27, 2006

(65) Prior Publication Data

US 2007/0085214 A1  Apr. 19, 2007

(30) Foreign Application Priority Data

Sep. 28, 2005 (JP) ................... 2005-281855

(51) Int. Cl.
*H01L 23/48* (2006.01)
(52) U.S. Cl. .......... 257/773; 257/734; 257/723; 365/51; 365/63
(58) Field of Classification Search .................. 257/773, 257/723, 734; 365/51, 63
See application file for complete search history.

(56) References Cited

U.S. PATENT DOCUMENTS

| | | | |
|---|---|---|---|
| 6,538,331 B2 * | 3/2003 | Masuda et al. | 257/777 |
| 6,995,320 B2 * | 2/2006 | Kusakabe et al. | 174/260 |
| 7,161,865 B2 * | 1/2007 | Fujisawa | 365/226 |
| 7,215,561 B2 * | 5/2007 | Park et al. | 365/52 |

FOREIGN PATENT DOCUMENTS

JP  2004 348950  12/2004

\* cited by examiner

*Primary Examiner* — Thinh T Nguyen
(74) *Attorney, Agent, or Firm* — Whitham Curtis Christofferson & Cook, PC

(57) ABSTRACT

A semiconductor device has a semiconductor chip which is usable as any one of 4-bit, 8-bit, and 16-bit structure devices, and a package for packaging the semiconductor chip. The semiconductor chip has first and second DQ pad groups of DQ system pads for said 16-bit structure device. The first DQ pad group is arranged in a first area at a vicinity of a middle part of a surface of the semiconductor chip while the second DQ pad group is arranged in a second area at an outer side of the first area on the surface. An additional pad necessary as one of DQ system pads for the 8-bit structure device except for pads included in the second DQ pad group is formed in the second area.

14 Claims, 15 Drawing Sheets

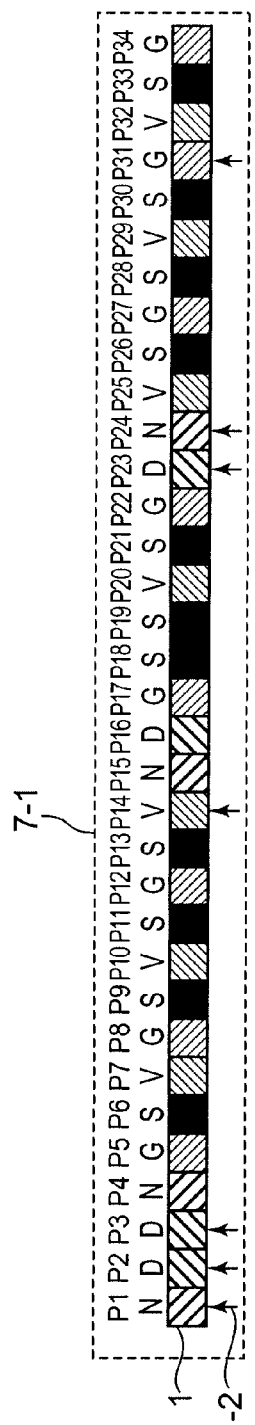
FIG. 9A
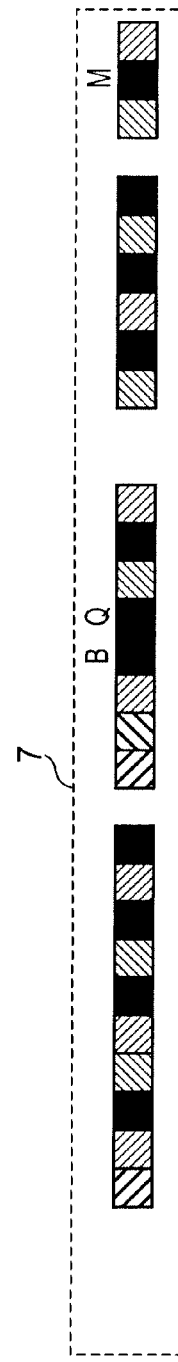
FIG. 9B ×16
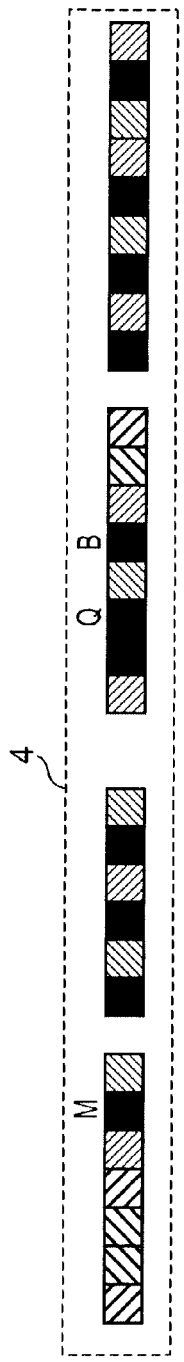
FIG. 9C ×8

SEMICONDUCTOR DEVICE

This application claims priority to prior application JP 2005-281855, the disclosure of which is incorporated herein by reference.

BACKGROUND OF THE INVENTION

This invention relates to a semiconductor device, in particular, to a semiconductor device having pads connected to package terminals (or pins) arranged along a center line on a surface of a semiconductor chip.

Recently, improvements in processing or response speed and enlargement of capacity of the semiconductor device are advanced. Moreover, miniaturization of a package is advanced to miniaturize the semiconductor device. A memory device having gigabit memory capacity and mounted on a small sized package has been developed as a dynamic random access memory (hereinafter simply called DRAM). A ball grid array (hereinafter simply called BGA) is known as the small sized package. The BGA having solder balls arranged on a package substrate is a surface mounting type. The BGA is adopted for a general-purpose DRAM, such as a DDR3 DRAM.

In the general-purpose DRAM, pin arrangement (i.e. assignment of signals to solder balls) is standardized by Joint Electron Device Engineering Council (JEDEC) and employed by DRAM vendors in common. Furthermore, there is a case where a 4-bit structure device (or a ×4 device) or an 8-bit structure device (or a ×8 device) is manufactured by the use of the same semiconductor chip as a 16-bit structure device (or a ×16-bit device). That is, there is a semiconductor chip to which a bonding option or a fuse option is provided to serve as any one of the ×4, the ×8 and the ×16 device.

The ×4 and the ×8 devices do not have pins called DQ system high-order bit side pins in the ×16 device. Accordingly, DQ system pins of the ×4 or ×8 device are connected to pads called DQ system low-order bit side pads with connecting wires in a related semiconductor device. As a result, the related semiconductor device has problems that the connecting wires connected to the DQ system pins of the ×4 or ×8 device are long and have high wiring density. Therefore, it is hard to secure enough wiring width and wiring space.

SUMMARY OF THE INVENTION

It is therefore an object of this invention to provide a semiconductor device which has relatively short wiring length and low wiring density when it serves as a ×4 or ×8 device.

Other objects of this invention will become clear as the description proceeds.

According to an aspect of this invention, a semiconductor device comprises a semiconductor chip usable as any one of at least an 8-bit structure device and a 16-bit structure device. A package is for packaging the semiconductor chip. In the semiconductor device, the semiconductor chip has first and second DQ pad groups of DQ system pads for the 16-bit structure device. The first DQ pad group is arranged in a first area at a vicinity of a middle part of a surface of the semiconductor chip and the second DQ pad group is arranged in a second area at an outer side of the first area on the surface. Furthermore, an additional pad necessary as one of DQ system pads for the 8-bit structure device except for pads included in the second pad group is formed in the second area.

In the semiconductor device, an arrangement of all pads formed in the second area may be decided on the basis of both of a pin arrangement when the package is for the 16-bit structure device and a pin arrangement when the package is for the 8-bit structure device.

In the semiconductor device, an arrangement of all pads formed in the second area is made to bring an equivalent for an arrangement of pads included in the first DQ pad group in existence.

BRIEF DESCRIPTION OF THE DRAWINGS

FIG. 9A to 9C is a detailed diagram showing a DQ system high-order bit side pad arrangement of the 16-bit structure device according to the first embodiment of this invention;

DESCRIPTION OF THE PREFERRED EMBODIMENTS

Figure 1:
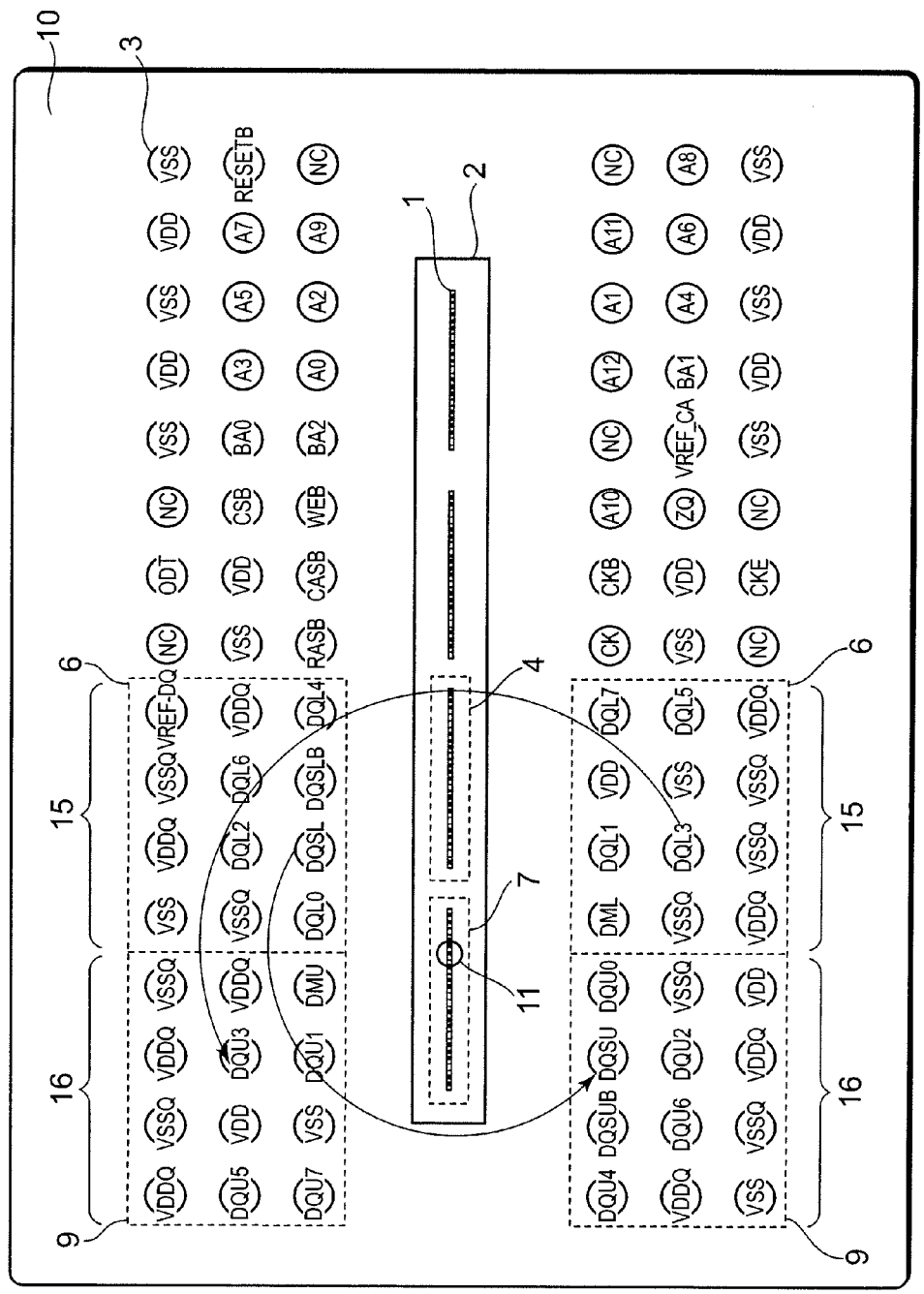
FIG. 1 is a pattern diagram of a package for a 16-bit structure device of a related semiconductor device.
Figure 2:
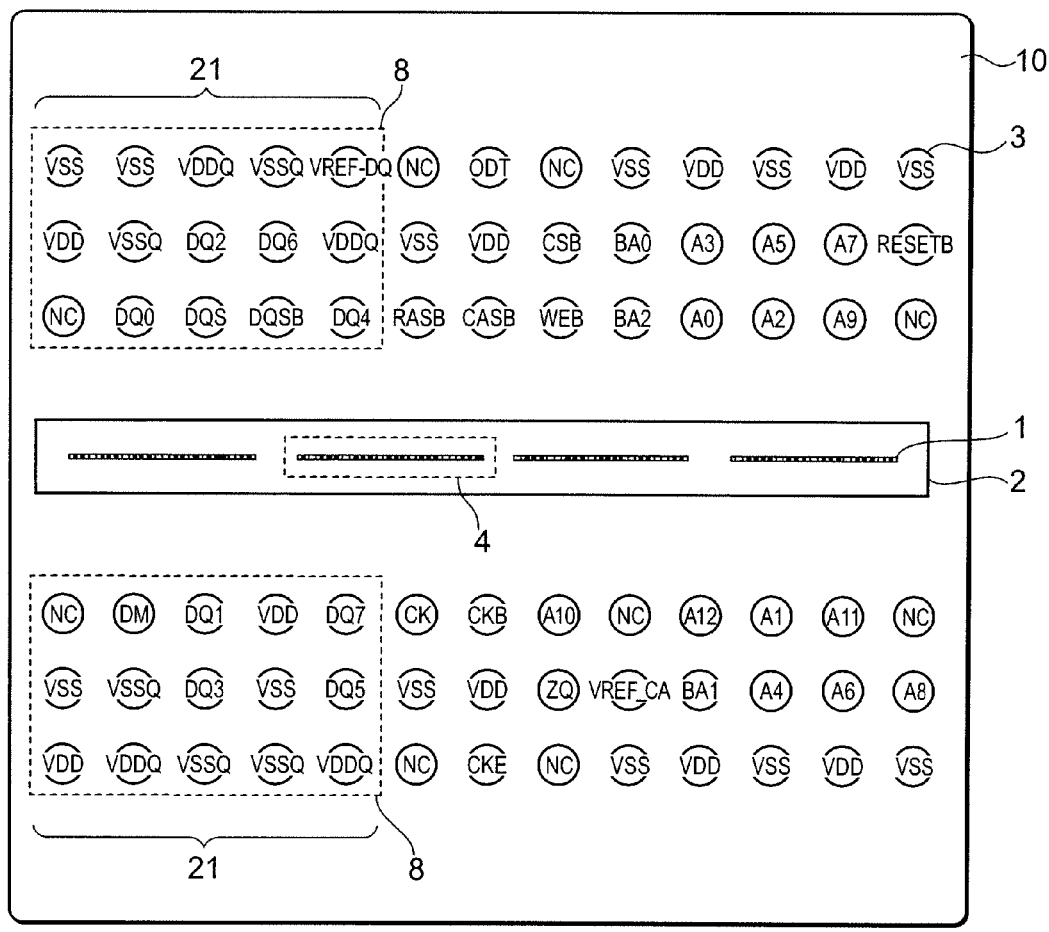
FIG. 2 is a pattern diagram of a package for a 8-bit structure device of the related semiconductor device.

Referring to FIGS. 1 and 2, a description will be first directed to a related semiconductor device. FIGS. 1 and 2 are pattern diagrams showing physical relationship among pads 1, pad area 2, pins 3 and package 10 of a ×16 device and a ×8 device which are manufactured by the use of the same semiconductor chips, respectively. For simplifying, each semiconductor chip mounted on the package 10 is not shown.

As understood from the comparison a pin arrangement of FIG. 1 with that of FIG. 2, the ×16 device has not only a first DQ system pin group 15 (corresponding to a DQ system pin group 21 for ×4/×8 device) but also a second DQ system pin group 16. The first DQ system pin group 15 is located at a vicinity of a middle part of the entirety of the pin arrangement while the second DQ system pin group 16 is located at an outer side of the first DQ system pin group 15. Since the second DQ system pin group 16 is considered to be added to the ×4/×8 device, the location that the second DQ system pin group 15 is in the outer side of the second DQ system pin groups 16 is natural.

The first and the second DQ system pin groups 15 and 16 include DQ pins. The DQ pins included in the first DQ system pin group 15 are individually assigned with the number from zero to seven (DQ0-DQ7). Moreover, the DQ pins included in the second DQ system pin group 16 are individually assigned with the number from eight to fifteen (DQ8-DQ15). Accordingly, the first and the second DQ system pin groups 15 and 16 are customarily called low-order bit side pin group and high-order bit side pin group, respectively. Hereinafter, the first and the second DQ system pin groups 15 and 16 will be referred to as the low-order bit side pin group and the high-order bit side pin group, respectively. The same applies to the pads 1, areas included in the pad area 2 and areas for the pins 3.

As shown in FIG. 1, in the ×16 device, a DQ system low-order bit side pin area 6 at which the low-order bit side pins of DQ system pins are formed is located at a side of the middle part (in horizontal direction of FIG. 1) of the package 10 as mentioned above. Thus, a first pad area 4 at which pads corresponding to the DQ system low-order bit side pins are formed is inevitably located at a side of the middle part of the semiconductor chip.

On the other hand, as shown in FIG. 2, the package 10 of the ×4/×8 device has no pins corresponding to the high-order bit side pins (DQ8-DQ15, etc.) of DQ system pins of the ×16 device. Accordingly, a DQ system high-order bit side pin area 9 does not exist and a DQ system pin area 8 is located at a side of a package end. However, in the ×4/×8 device, the DQ system pad area 4 located at the middle part of the semiconductor chip is used like the ×16 device because assignment of the DQ pads on the semiconductor chip is the same regardless of bit structure.

Figure 3:
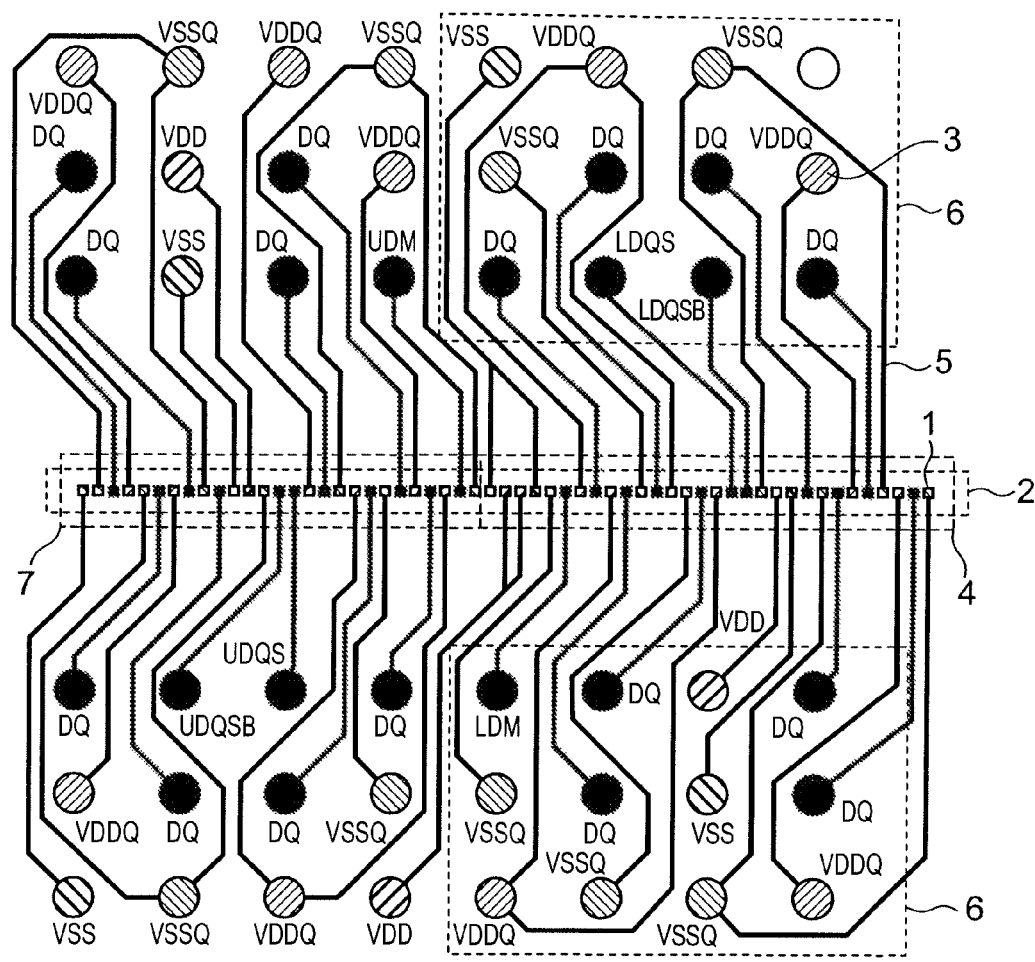
FIG. 3 is a diagram showing a pad arrangement of the 16-bit structure device of the related semiconductor device.
Figure 4:
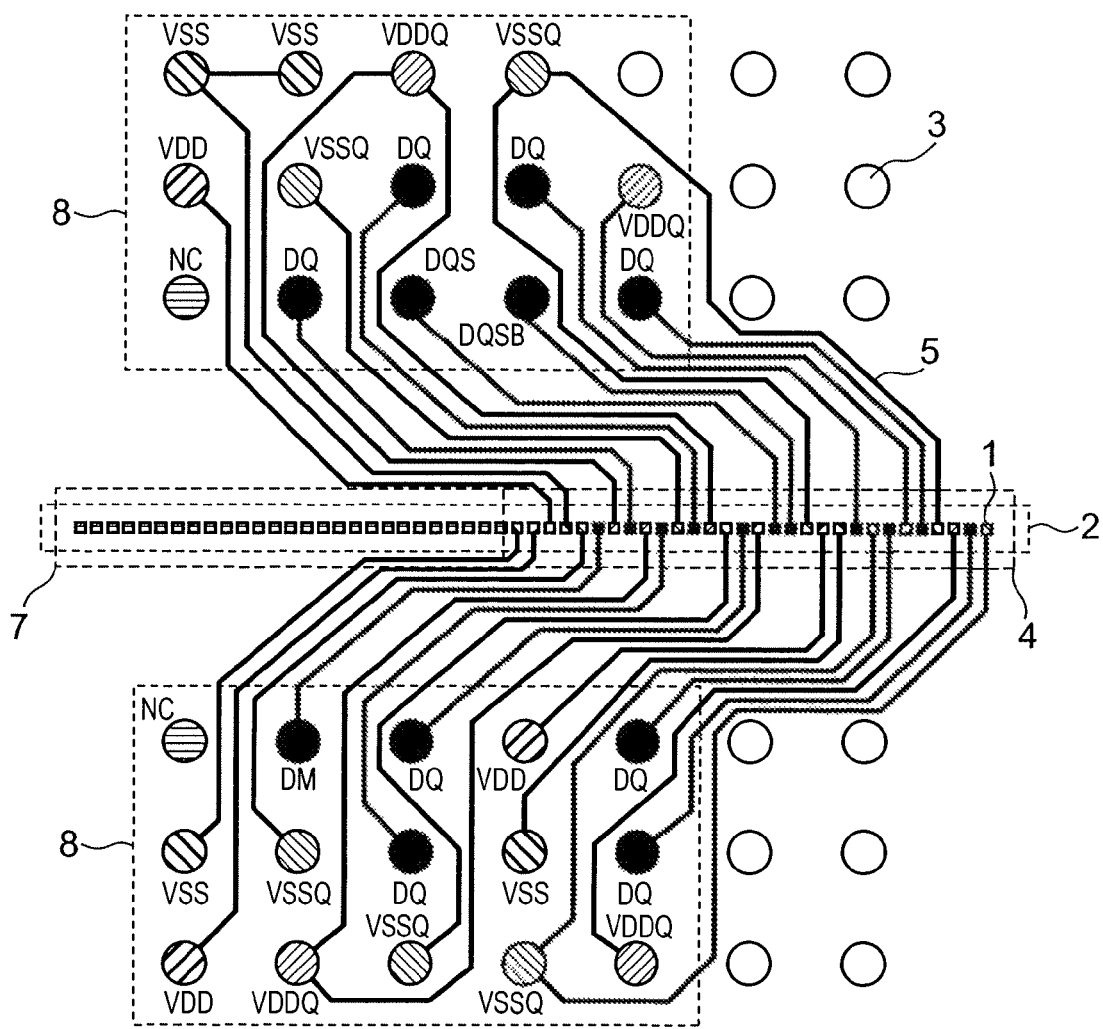
FIG. 4 is a diagram showing a pad arrangement of the 8-bit structure device of the related semiconductor device.

FIGS. 3 and 4 are pattern diagrams, which show physical relationship among DQ system pads 1, DQ system pins 3 and connecting wires 5 electrically connecting between them, of the ×16 device and the ×8-bit device, respectively.

As easily understood from comparison between FIGS. 3 and 4, distances between the pins 3 of the DQ system pin area 8 and the pads 1 of the DQ system pad area 4 on the semiconductor chip of the ×4/×8 device are longer than those of the ×16 device. In addition, wiring density at the vicinity of the DQ system pad area 4 of the ×4/×8 device is higher than that of the ×16 device.

Thus, a ×4/×8/×16 common DRAM chip has a problem that connecting wires for DQ system signals (DQ, DQS, DM, etc.) and DQ system power supply/ground (VDDQ/VSSQ) on a package are long. The chip further has another problem that wiring density is high at the vicinity of the pads and it is hard to secure enough wiring width and intervals.

The former problem causes increase of inductance of connecting wires for the DQ system signals and the DQ system power supply/ground on the package, increase of power supply or ground noise by simultaneous switching during data output, deterioration of a data output signal, decrease of voltage margin and timing margin of the device, and deterioration of a high frequency characteristic of the device.

The latter problem causes not only decrease of freedom of design for a package layout but also decrease of reliability of manufacturing. This is because laying wires must be made near the limit of design rule.

To solve the problems mentioned above, there is an idea that the DQ system pin area 8 of the ×4/×8 device is located at a side of the middle part of the package similarly as for the DQ system low-order bit side pin area 6 of FIG. 1. However, such a pin arrangement is unrealistic though it is technically possible. Such an arrangement of the pins 3 is asymmetric (with respect to the horizontal direction) against the package 10 and it is undesirable regarding thermal and stress characteristics. In addition, the package size is as large as the ×16 device shown in FIG. 1.

Figure 5:
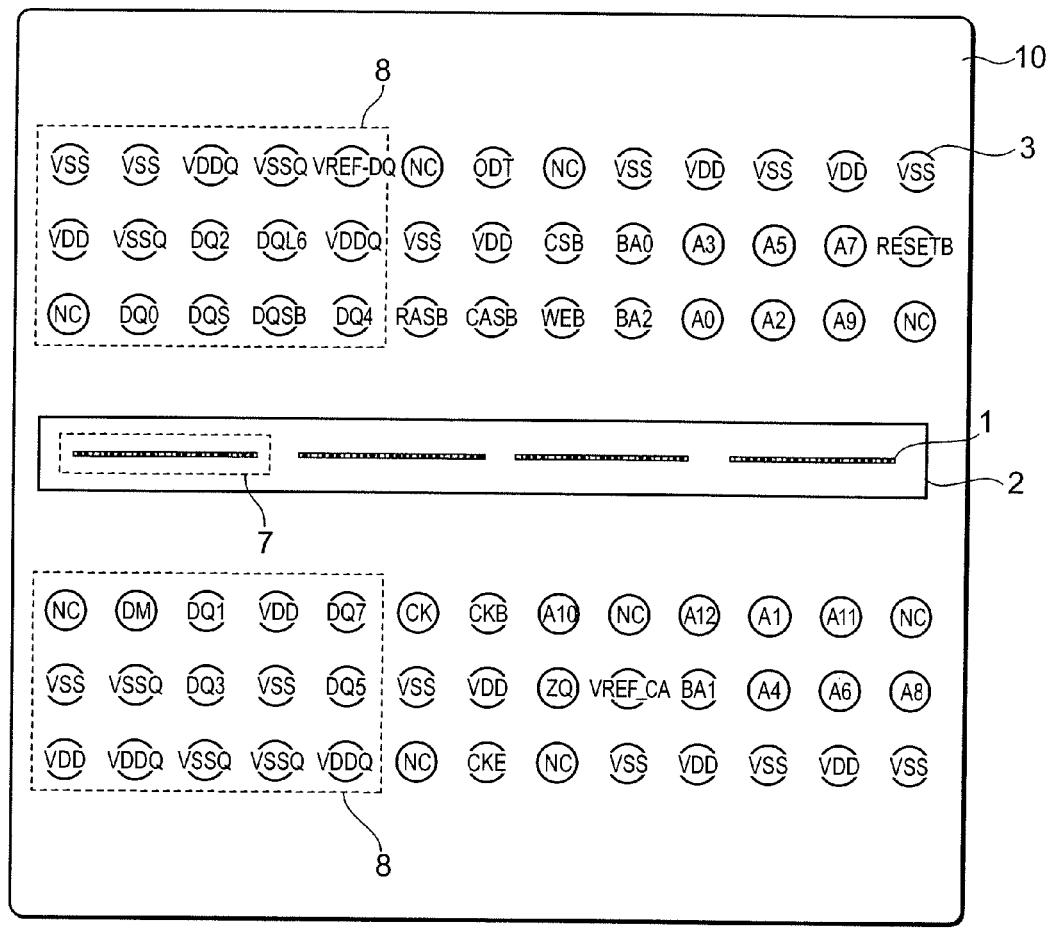
FIG. 5 is the pattern diagram of the package for the 8-bit structure device of the related semiconductor device and is for describing a problem.

As another method for solving the above mentioned problems, there is an idea that a second pad area 7 which is located at a side of the chip end and which is to be assigned to the DQ system high-order bits of the ×16 device is assigned to the DQ system pad area of the ×4/×8 device as illustrated in FIG. 5. However, the method has following problems. A case of a DDR3 DRAM is considered as follows.

In the ×16 device of the DDR3 DRAM, as shown in FIG. 1, the pin arrangement of the DQ system high-order bit side pin area 9 and that of DQ system low-order bit side pin area 6 are symmetric with respect to a boundary point 11. That is, if the pin arrangement of the DQ system high-order bit side pin area 9 revolves around the boundary point 11 by 180 degree, it substantially corresponds to that of DQ system low-order bit side pin area 6. Accordingly, it is impossible to connect the pads 1, which are to be connected to the pins 3 of the low-order bit side area 6, to the pins 3 of the high-order bit side area 9 without change of wiring arrangement (or wiring order).

Additionally, it is possible that a certain DQ pad (e.g. DQ8) for a DQ signal in a certain bit structure device is assigned to a different DQ pad (e.g. DQ0) for a different DQ signal in a different bit structure device. Such a technique is disclosed in Unexamined Japanese Patent Publication NO. 2004-348950 (Document 1). However, even if the pad is for the DQ system signals, it is not assigned to a functionally different pad, such as a DQS (data strobe), a DM (data mask) or the like. This is because it is generally hard that a pad is used as a functionally different pad without adjustments, such as adjustment of terminal capacity.

Figure 6:
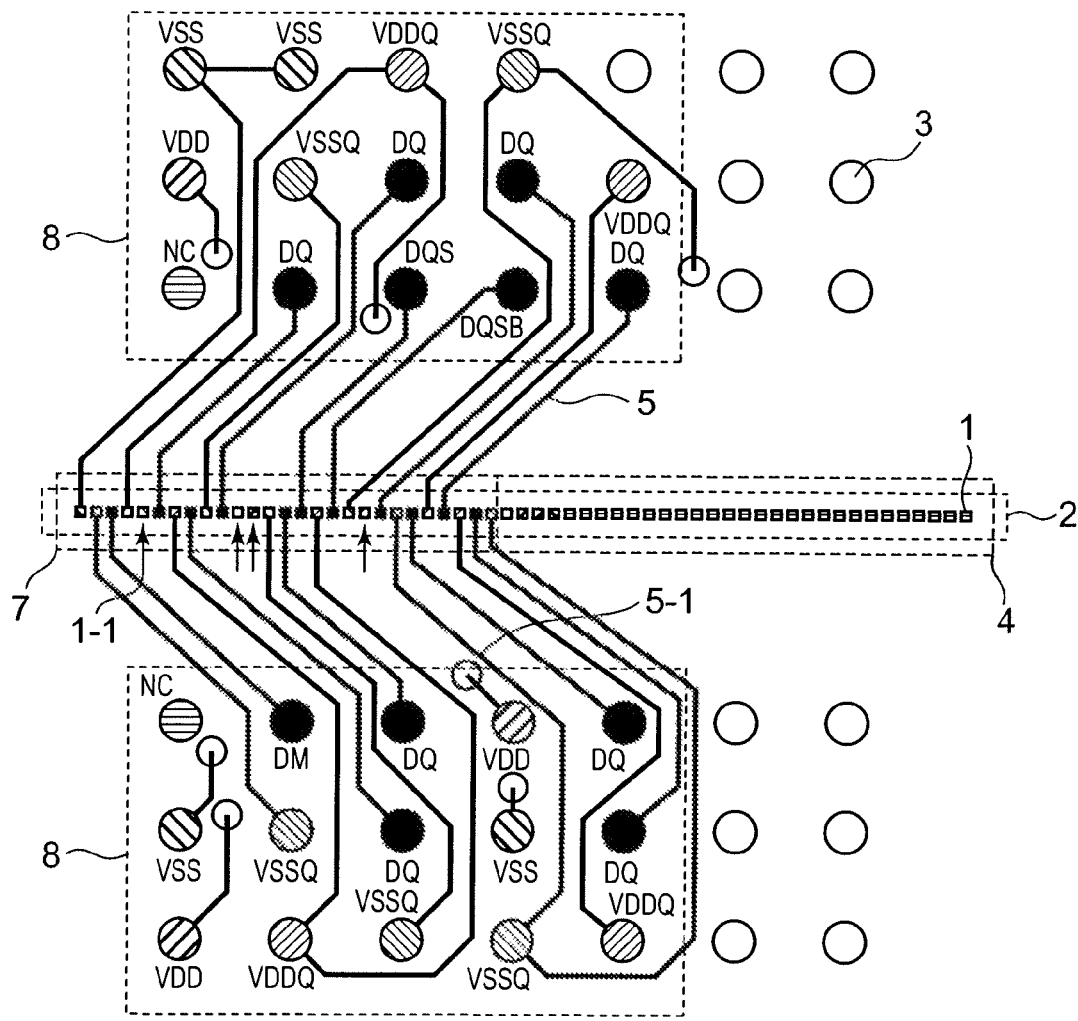
FIG. 6 is a diagram showing the pad arrangement of the 8-bit structure device of the related semiconductor device and is for describing the problem.

Moreover, there is a problem of pads for power supply, even if the assignment problem of the DQ pads for the DQ system signals is solved. For example, even when the DQ pads for DQ system signals can be connected to the pins as illustrated in FIG. 6, any of the power supply/ground pads and the DQ system power supply/ground (VDDQ/VSSQ) pads 1-1 can not be connected to connecting wires 5-1. This does not mean that the pads 1-1 are not physically connected to the connecting wires 5-1. It means that the connecting wires 5 can not connect between the pins 3 and the pads 1 to keep the connection relationship between the pins 3 and the pads 1 in a case where the DQ system low-order bit side pad area 4 of the ×16 device is used as the DQ system pad area of the ×4/×8 device. In this case, the connection relationship between the pins 3 and the pads 1 must be maintained because it decides basic electrical characteristics of the package and change of it considerably deteriorates the electrical characteristics.

For the reasons mentioned above, in the related semiconductor device, the DQ system low-order bit side pad area 4 of the ×16 device is assigned as the DQ system pad area of the ×4/×8 device.

Figure 7:
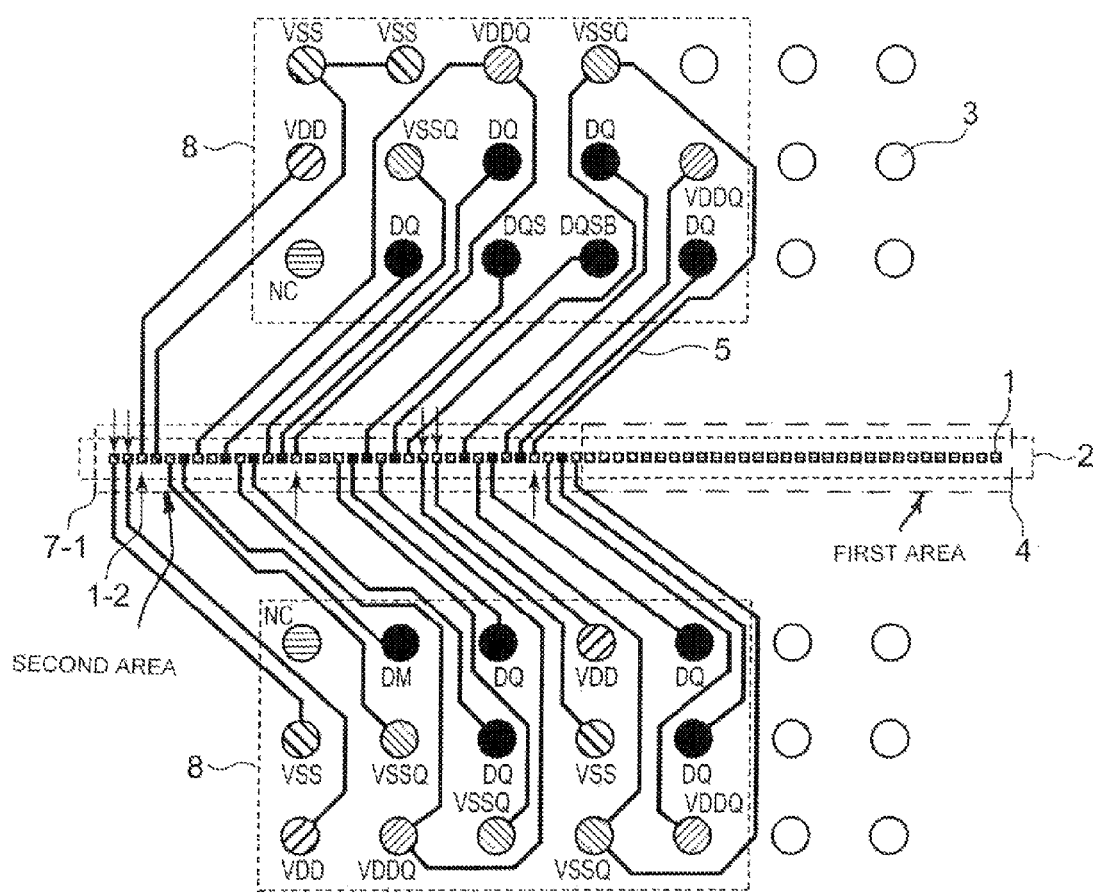
FIG. 7 is a diagram showing a pad arrangement of a 8-bit structure device according to a first embodiment of this invention.
Figure 8:
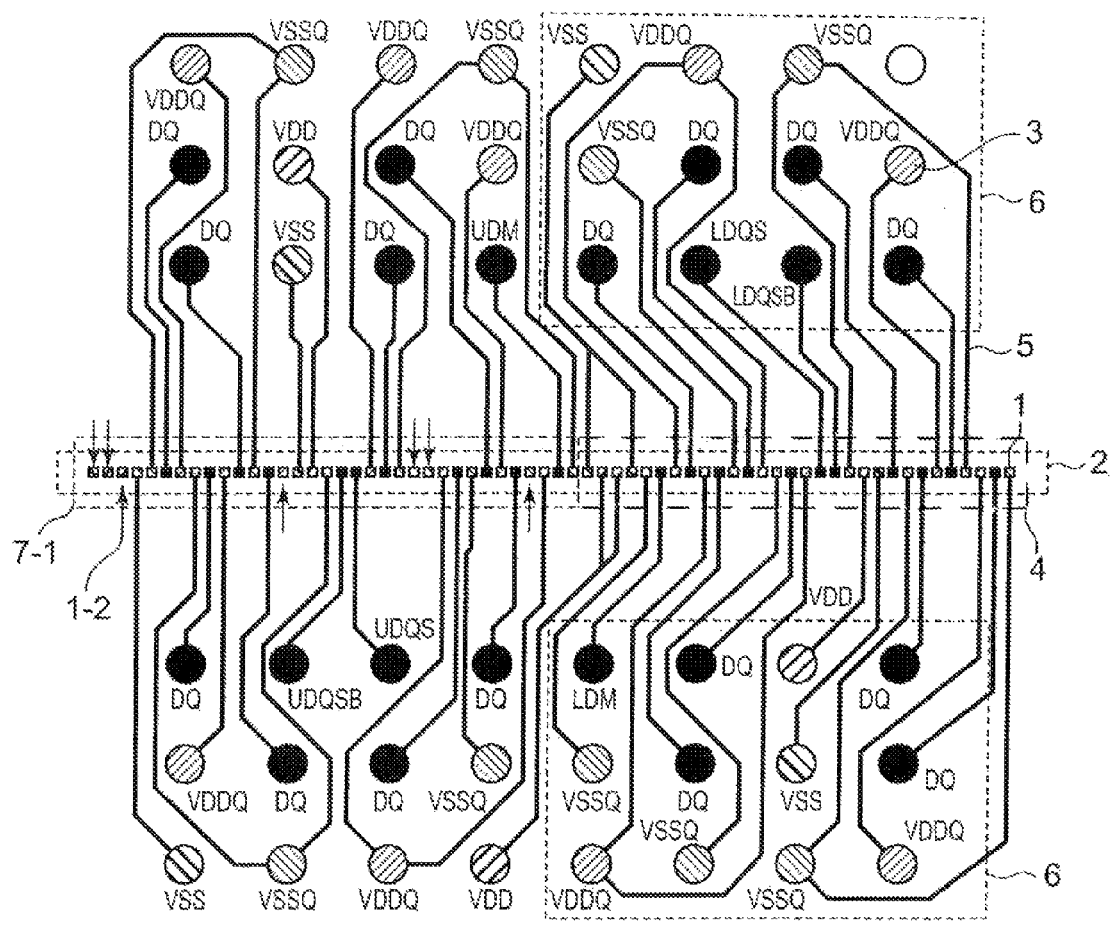
FIG. 8 is a diagram showing a pad arrangement of a 16-bit structure device according to the first embodiment of this invention.

Referring to FIGS. 7 to 9, a description will be made of a semiconductor device according to a first embodiment of this invention.

The semiconductor device has a semiconductor chip and a package for packaging the semiconductor chip. The semiconductor chip has a pad area along its center line on a surface thereof. A plurality of pads is formed at the pad area (see FIG. 1). The package has pins (or solder balls) (see FIG. 1) which are arranged according to the arrangement standardized by JEDEC (Joint Electron Device Engineering Council) to be mounted on a circuit board. Furthermore, the package has package connecting wires for electrically connecting between these pins and the pads of the semiconductor chip mounted thereon.

The semiconductor chip has a bonding option or a fuse option to serve as any one of ×4, ×8 and ×16 devices or as one of ×8 and ×16 devices. That is, the semiconductor chip can be used as any one of the ×4, the ×8 and the ×16 devices or one of the ×8 and the ×16 devices and it is set to one of the ×4, the ×8 and the ×16 devices or one of the ×8 and the ×16 devices when or after it is packaged in the package.

The plural pads formed on the semiconductor chip are arranged to correspond to the pin arrangement of the package that is standardized by JEDEC. Specifically, a DQ system high-order bit side pad area for DQ system high-order bits (DQ8-DQ15) of the ×16 device, a DQ system low-order bit side pad area for DQ system low-order bits (DQ0-DQ7) and CA system pad areas are formed in a line from one end of the semiconductor chip toward the other end.

In this embodiment, improvement is made for pad arrangement and wiring for DQ system signals (DQ, DM, DQS, DQSB or the like), which are driven at a data rate of a double clock frequency (DDR: Double Data Rate), and DQ system power supply/ground (VDDQ, VSSQ). The arrangement of the remaining pads for command/address signals and normal power supply/ground (VDD, VSS) and the remaining connecting wires are identical to those of the related semiconductor device.

It is assumed that the arrangement of the DQ system pads and the connection relationship between their pads and the DQ pins are electrically optimized in each of the ×16 device and the ×8 device and are not changed.

Specifically, in the embodiment, the DQ system high-order bit side pad area of the semiconductor chip includes all pads which are necessary for the DQ system pads of the ×8 device. In other words, additional pads are formed in the DQ system high-order bit side pad area so that an equivalent for the pad arrangement of the DQ system low-order bit side pad area or the DQ pad arrangement of the ×4/×8 device exists or appears in the DQ system high-order bit side pad area.

FIG. 7 shows the DQ pad arrangement of the 8-bit structure device which is the semiconductor device according to the first embodiment. FIG. 8 shows the DQ pad arrangement of the 16-bit structure device which is the semiconductor device according to the first embodiment. FIGS. 9A-9C show the detailed pad arrangement in the DQ system high-order bit side pad area 7-1 of the 16-bit structure device.

First, referring to FIGS. 8 and 9, the description will be made about a case of the 16-bit structure device.

In the case of the 16-bit structure device, the pads 1 and the pins 3 are connected as illustrated in FIG. 8. The connecting wires connecting the pads 1 included in the DQ system low-order bit side pad area 4 and corresponding pins 3 are identical to those of the related semiconductor device (see FIG. 3).

On the other hand, though the pads 1 included in the DQ high-order bit side area 7-1 maintain the same connection relationship as that of the related semiconductor device, pads 1-2 (indicated by arrows) connected to nothing are included therein.

FIG. 9A shows details of the pads included in the DQ system high-order bit side pad area 7-1. In FIG. 9A, symbols of "P1", "P2", . . . , and "P34" represent pad numbers. Moreover, symbols of "N", "D", "G", "V" and "S" represent a VSS (or GND) pad, a VDD pad, a VSSQ (or GND for DQ) pad, a VDDQ (or a power supply for DQ) pad, and a pad for a DQ system signal (DQ, DQS, DM or the like), respectively. In addition, symbols of "Q", "B" and "M" represent DQS, DQSB and DM pads, respectively.

FIG. 9B shows the pads which is used for the 16-bit structure device and extracted from the pads included in the DQ system high-order bit side pad area 7-1. In the ×16 device of this embodiment, the pads P4-P13, P15-P22, P25-P30 and P32-P34 are connected to the corresponding pins 3 with the connecting wires 5 as shown in FIG. 8.

FIG. 9C shows the pads which is used for the 8-bit structure device and extracted from the pads included in the DQ system high-order bit side pad area 7-1. By the use of these pads, the DQ system pins of the 8-bit structure device can be connected to the corresponding pads included in the DQ system high-order bit side pad area 7-1 with keeping the connection relationship of the related semiconductor device as illustrated in FIG. 7. This is because the DQ system high-order bit side pad area 7-1 includes a function of the pad arrangement of the DQ system low-order bit side pad area 4. In other words, in this embodiment, the additional pads are formed in the DQ system high-order bit side pad area 7-1 so that an equivalent for the pad arrangement of the DQ system low-order bit side pad area 4 exists or appears in the DQ system high-order bit side pad area 7-1. Here, though it is unnecessary that the pad arrangement of the DQ system high-order bit side pad area 7-1 is quite identical to that of the DQ system low-order bit side pad area 4, they must be functionally (or substantially) equivalent to each other. For example, in the embodiment, though the order of the pads P19 and P20 are different from those of the DQ system low-order bit side pad area 4, it can be considered that the pad arrangements are substantially equal to each other. This is because pins 3 to be connected the pads P19 and P20 are placed at opposite sides regarding the pad area 4 and thereby the connecting wires 5 connected to the pads P19 and P20 are extended in directions opposite to each other.

The description will be made in more detail about the 8-bit structure device. In the 8-bit structure device according to the embodiment, the pads of the DQ system high-order bit side pad area 7-1, or the DQ system pad area located at a side of the chip end, are used to be connected to the DQ system pins as mentioned above.

The pads 1-2 which is not used for the ×16 device exist in the DQ system high-order bit side pad area 7-1 as mentioned above. These pads 1-2 are the power supply/ground system pads and provided to be used for the ×4/×8 device. Accordingly, they can be connected to the corresponding pins of the ×8 device without problems.

Furthermore, because the DQS pad P19 is common regardless of bit structure, it can be connected to the corresponding pin of the ×8 device without problems.

The pads P9, P11, P13, P26, P28 and P30, which belongs the DQ pads, are changed to different DQ pads and used according to the bit structure. Such a change of the pads can be realized by means of a method disclosed in the above-mentioned Document 1, for example.

The pads P6 and P33 have both functions of DQ and DM while the pads P18 and P21 have both functions of DQ and DQSB. The functions of these pads are changed according to the bit structure. Such a change of the functions may be realized by, for example, connecting (or mounting, on the semiconductor chip,) input-output circuits corresponding to the functions and changing an input-output signal by mode signals corresponding to the functions. In this case, output circuits occupying the greater part of a chip area for the input-output circuits are common except for some connecting wires and some logic circuits. Accordingly, the output circuits can have a major part jointly. Therefore, a slight overhead of the chip area is necessary for the input-output circuits. In addition, it is unnecessary to provide input-output circuits for functions to each pad when all or a part of the input-output circuits can be shared by two or more pads. As a result, the overhead can become smaller. Specifically, specifications of terminal capacity regarding DQ, DM, DQS and DQSB are equal to one another. Therefore, an output circuit (or an output transistor) occupying a major part of the terminal capacity can be shared by the DQ, DM, DQS and DQSB. Additionally, because the pad is only used for input and not used for output when it is used for DM, an output circuit thereof merely serves as a load of the terminal capacitor. Because input circuits for DQ and DM are common in type, one input circuit can be shared by DQ and DM. On the other hand, because input circuits for DQ and DQS or DQSB are different in type, one input circuit can not be shared by DQ and DQS or DQSB. For example, DQ uses an input circuit of a pseudo differential circuit using a referential voltage (VREF) while each of DQS and DQSB uses a differential input circuit. Accordingly, it is necessary to mount different input circuits corresponding functions for DQ and DQS or DQSB.

As mentioned above, in this embodiment, the DQ system high-order bit side pad area 7-1, which located at the side of the chip end, of the ×16 device can be assigned as the DQ pad area of the ×4/×8 device.

Thus, in a case of ×4/×8 device, the connecting wires for DQ system signals can be reduced in comparison with the related semiconductor device. Then, inductance of the connecting wires for the DQ system signals and the DQ system power supply/ground on the package can be reduced, power supply or ground noise by simultaneous switching during data output can be reduced, quality of a data output signal can be improved, voltage margin and timing margin of the device can be increased, and a high frequency characteristic of the device can be improved.

Further, the embodiment can reduce wiring density at the vicinity of the DQ pads of the ×4/×8 device. Enough wiring width and intervals can be secured. Freedom of design for a package layout can be increased and reliability of manufacturing can be improved.

Though the description mentioned above is made about the 8-bit structure device, much the same is true on the 4-bit structure device. Difference is only that the DQ pins and pads for 4 bits are not used (or are NC).

Figure 10:
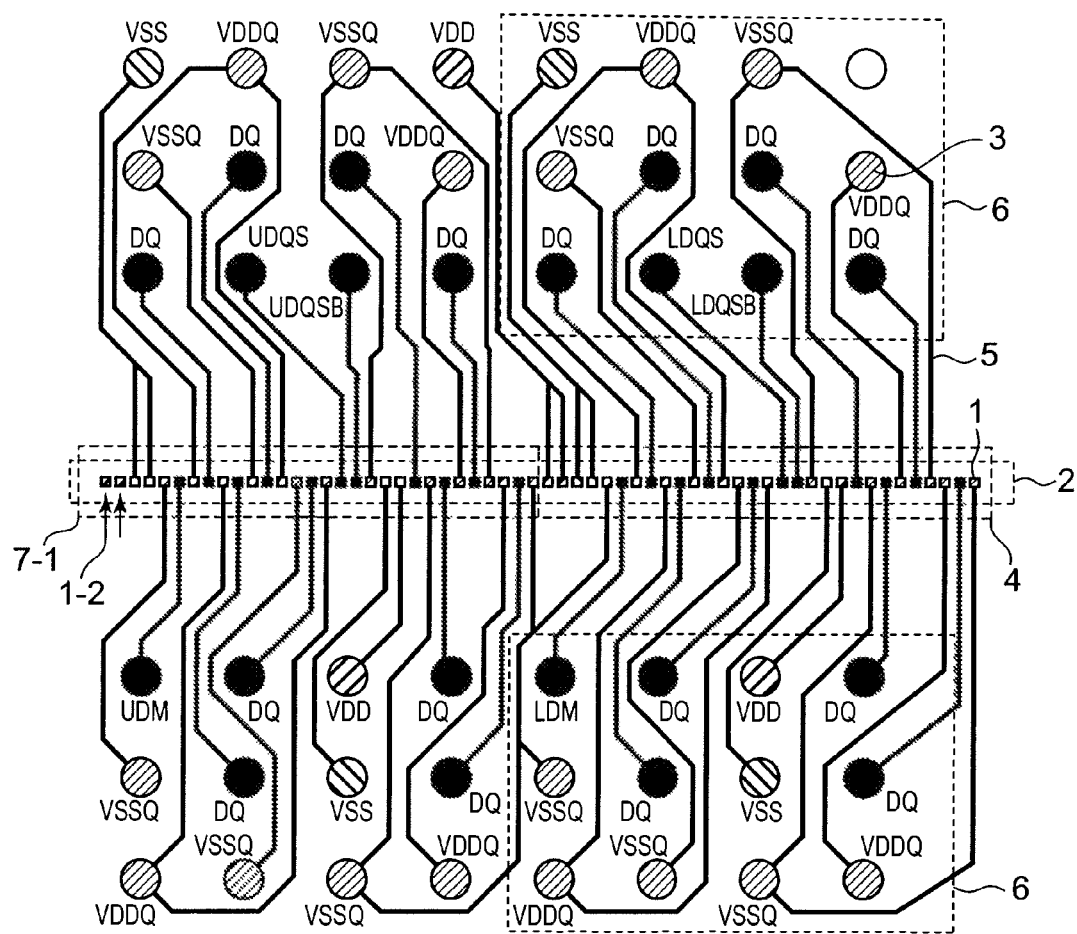
FIG. 10 is a diagram showing a pad arrangement of a 16-bit structure device according to a second embodiment of this invention.

Referring to FIG. 10, the description will be made about a semiconductor device according to a second embodiment of this invention.

Though FIG. 10, similarly as for FIG. 8, shows the DQ system pad arrangement of the 16-bit structure device, pin arrangement is different from that of FIG. 8. In FIG. 8, the pin arrangement corresponds to ×16 device of DDR3 DRAM standardized by JEDEC and the DQ system high-order bit pin arrangement and the DQ system low-order bit pin arrangement are symmetric with respect to the boundary point. On the other hand, in this embodiment, there is a physical relationship of parallel displacement with respect to the boundary point between the DQ system high-order bit pin arrangement and the DQ system low-order bit pin arrangement. That is, in FIG. 10, if the pin arrangement of the DQ system low-order bit side area is shifted toward the left side, it corresponds to the pin arrangement of the DQ system high-order bit side area. Similarly, the pad arrangement of the DQ system high-order bit side corresponds to the pad arrangement of the DQ system low-order bit side, if the pad arrangement of the DQ system low-order bit side is shifted to the left side of FIG. 10.

Because this embodiment employs the pin arrangement and the pad arrangement mentioned above, the number of the additional pads can be reduced in comparison with the first embodiment. Concretely, only two pads are added in comparison with the related semiconductor device. The additional pads are used for assigning the DQ system high-order bit side pad area 7-1 of the ×16 device as the DQ pad area of the ×4/×8 device.

In this embodiment, pad assignment change between the ×16 device and the ×4/×8 device is made about the same function (i.e. DQ-DQ, DQS-DQS, DM-DM and so on). Accordingly, circuits necessary for the pad assignment change corresponding to the bit structure may be very small. Thus, the overhead of the chip area can be reduced in comparison with the first embodiment.

Figure 11:
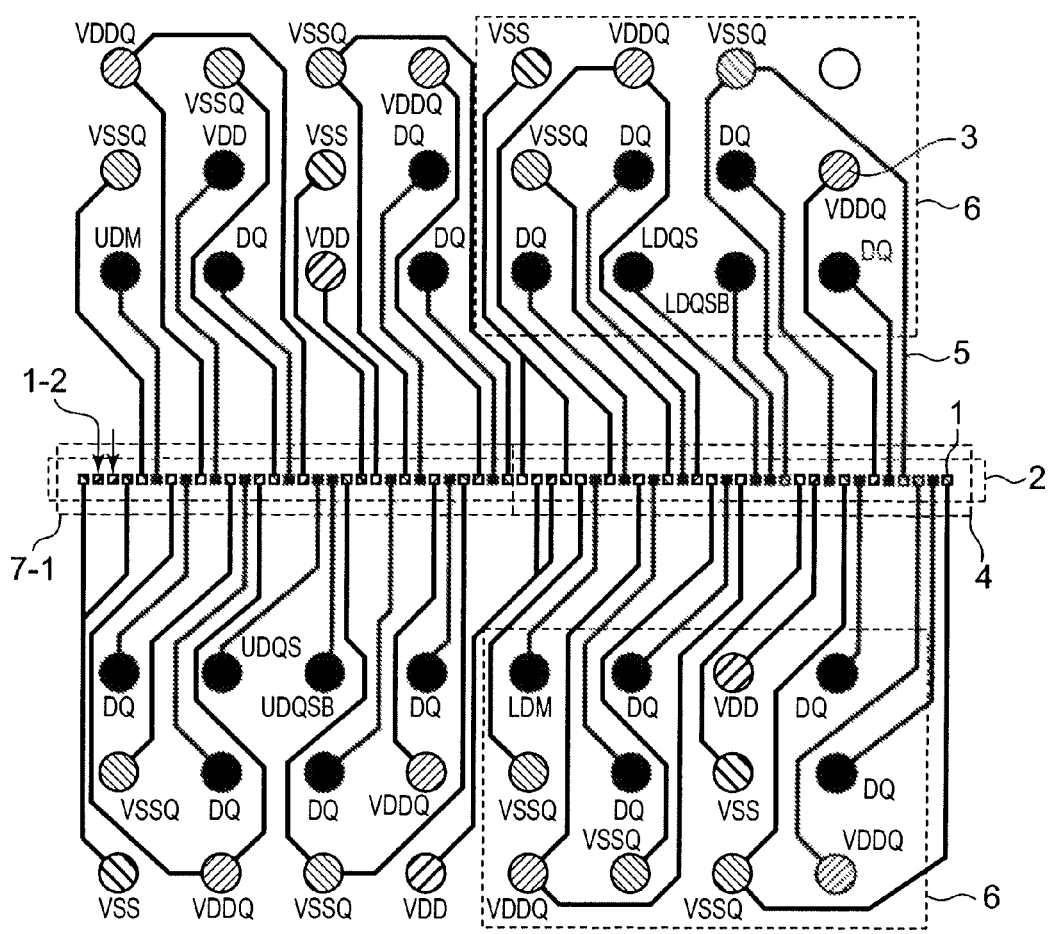
FIG. 11 is a diagram showing a pad arrangement of a 16-bit structure device according to a third embodiment of this invention.

Referring to FIG. 11, the description will be made about a semiconductor device according to a third embodiment of this invention.

FIG. 11 shows DQ system pad arrangement of a 16-bit structure device, similarly as for FIG. 8. In this embodiment, the DQ system high-order bit side pill arrangement is similar to the pin arrangement that the DQ system low-order bit side pin arrangement is sifted toward left side and reversed with regard to a line of pads. The DQ system high-order bit side pad arrangement is similar to the pad arrangement that the DQ system low-order bit side pad arrangement is shifted toward left side.

In this embodiment, only two pads are added in comparison with the related semiconductor device, similarly as for the second embodiment. Furthermore, pad assignment change between the ×16 device and the ×4/×8*l* device is made about the same function (i.e. DQ-DQ, DQS-DQS, DM-DM and so on). Accordingly, circuits necessary for the pad assignment change corresponding to the bit structure may be very small. Thus, the overhead of the chip area can be reduced in comparison with the first embodiment.

Figure 12:
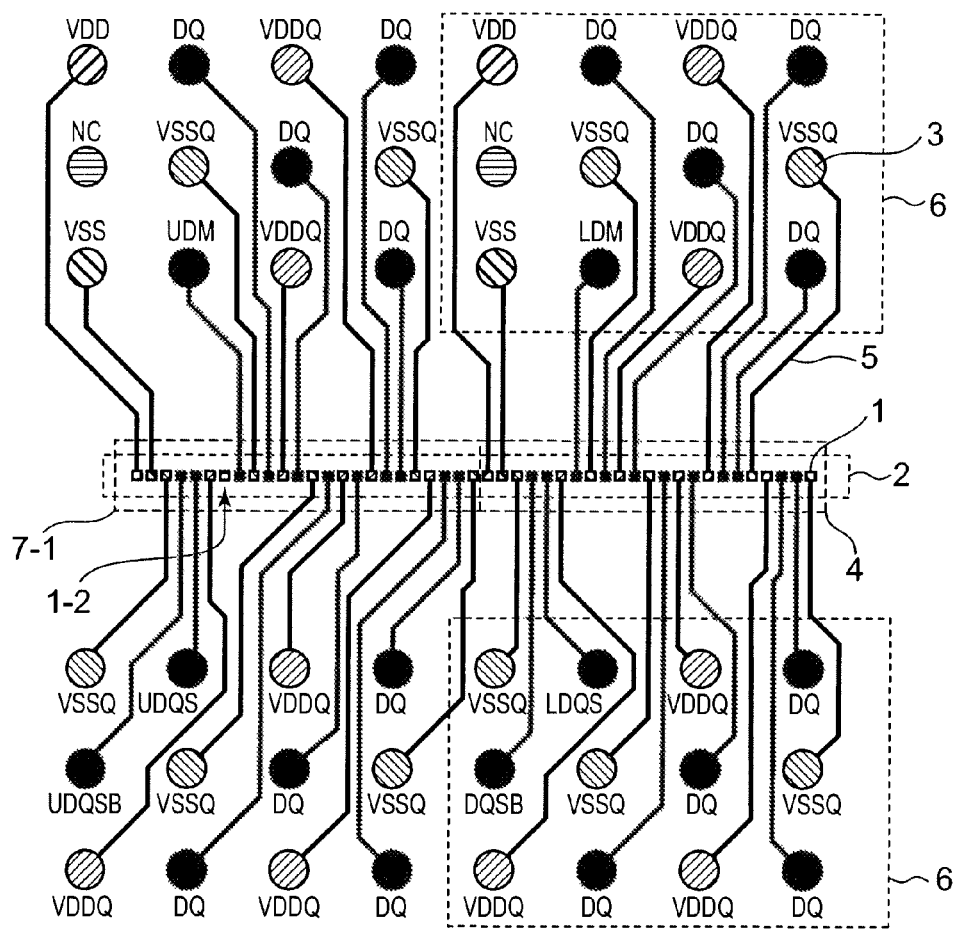
FIG. 12 is a diagram showing a pad arrangement of a 16-bit structure device according to a forth embodiment of this invention.
Figure 13:
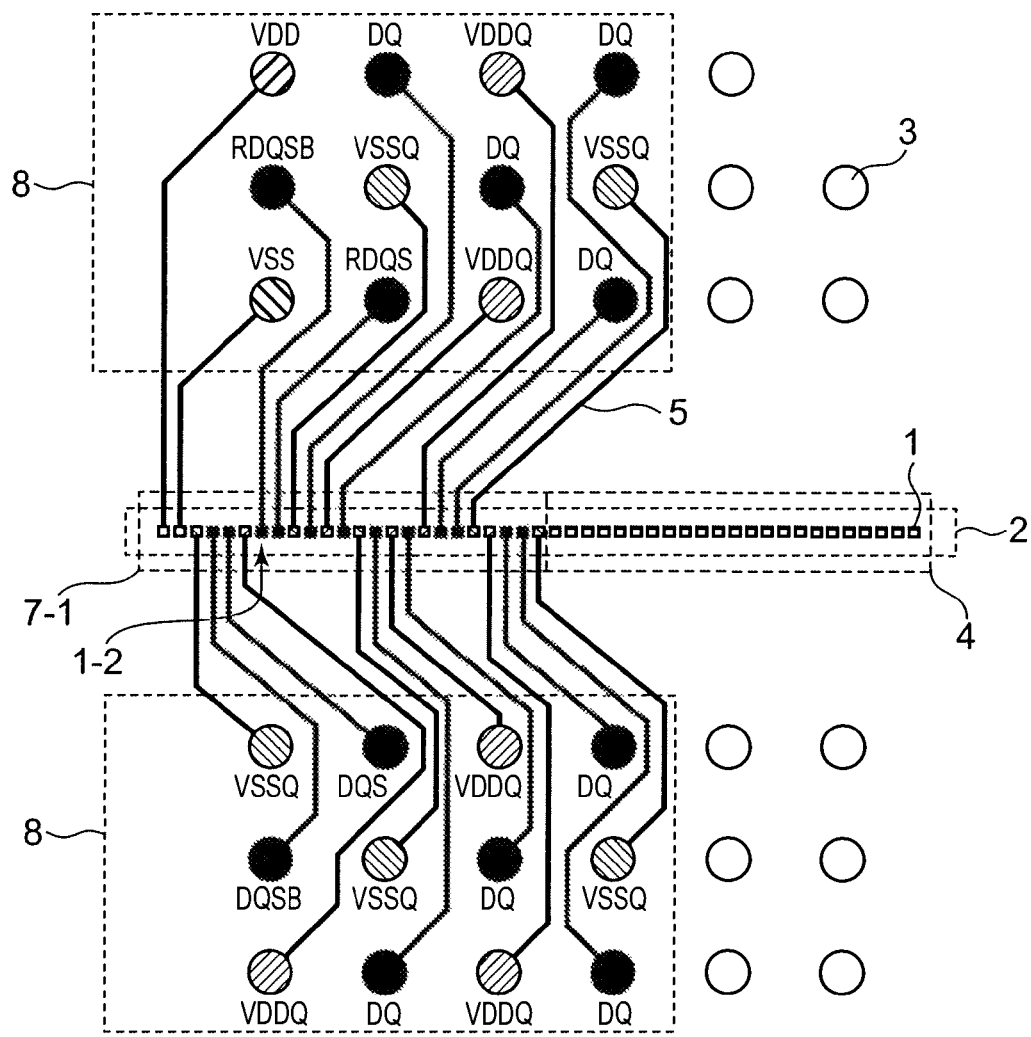
FIG. 13 is a diagram showing a pad arrangement of an 8-bit structure device according to the forth embodiment of this invention.

Referring to FIGS. 12 and 13, the description will be made about a semiconductor device according to a fourth embodiment of this invention. FIG. 12 shows DQ system pad arrangement of a 16-bit structure device while FIG. 13 shows DQ system pad arrangement of an 8-bit structure device.

Though the second and the third embodiments are based on the pin arrangement of the DDR3 DRAM, this embodiment employs a quite different pin arrangement. The high-order bit side pin arrangement corresponds to the pin arrangement that the low-order bit side pin arrangement is sifted toward left side of FIG. 12. Similarly, the high-order bit side pad arrangement corresponds to the pad arrangement that the low-order bit side pin arrangement is sifted toward left side of FIG. 12.

In this embodiment, no pad is added in comparison with the related semiconductor device. Furthermore, pad assignment change between the ×16 device and the ×4/×8 device is made about the same function (i.e. DQ-DQ, DQS-DQS and so on) except for change between DM and RDQS. Accordingly, circuits necessary for the pad assignment change corresponding to the bit structure may be very small. Thus, the overhead of the chip area can be reduced in comparison with the first embodiment.

In FIG. 13, function pins RDQS and RDQSB are seen. These pins are for leads particular to the ×8 device and belongs DQS and DQSB pins. The pin RDQSB is connected to a pad 1-2. The pad 1-2 is not new. This is because, the pad corresponding to the pin RDQSB is provided in the DQ system low-order bit side pad area 4 of the ×16 device. In this embodiment, the pad 1-2 is located in the pad area 7-1 because the DQ system high-order bit side pad area of the ×16 device includes all of necessary pads for ×4/×8 device.

Figure 14:
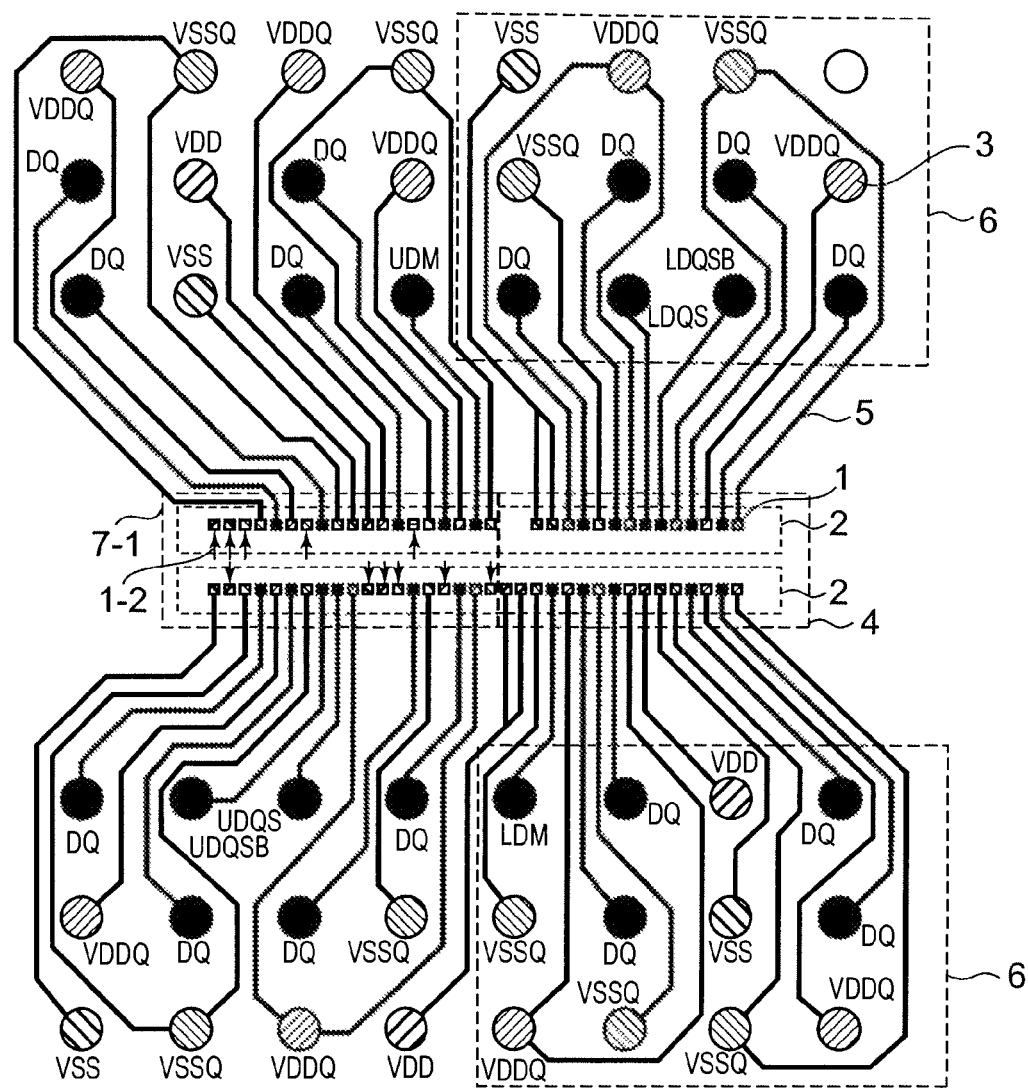
FIG. 14 is a diagram showing a pad arrangement of a 16-bit structure device having two line pads.
Figure 15:
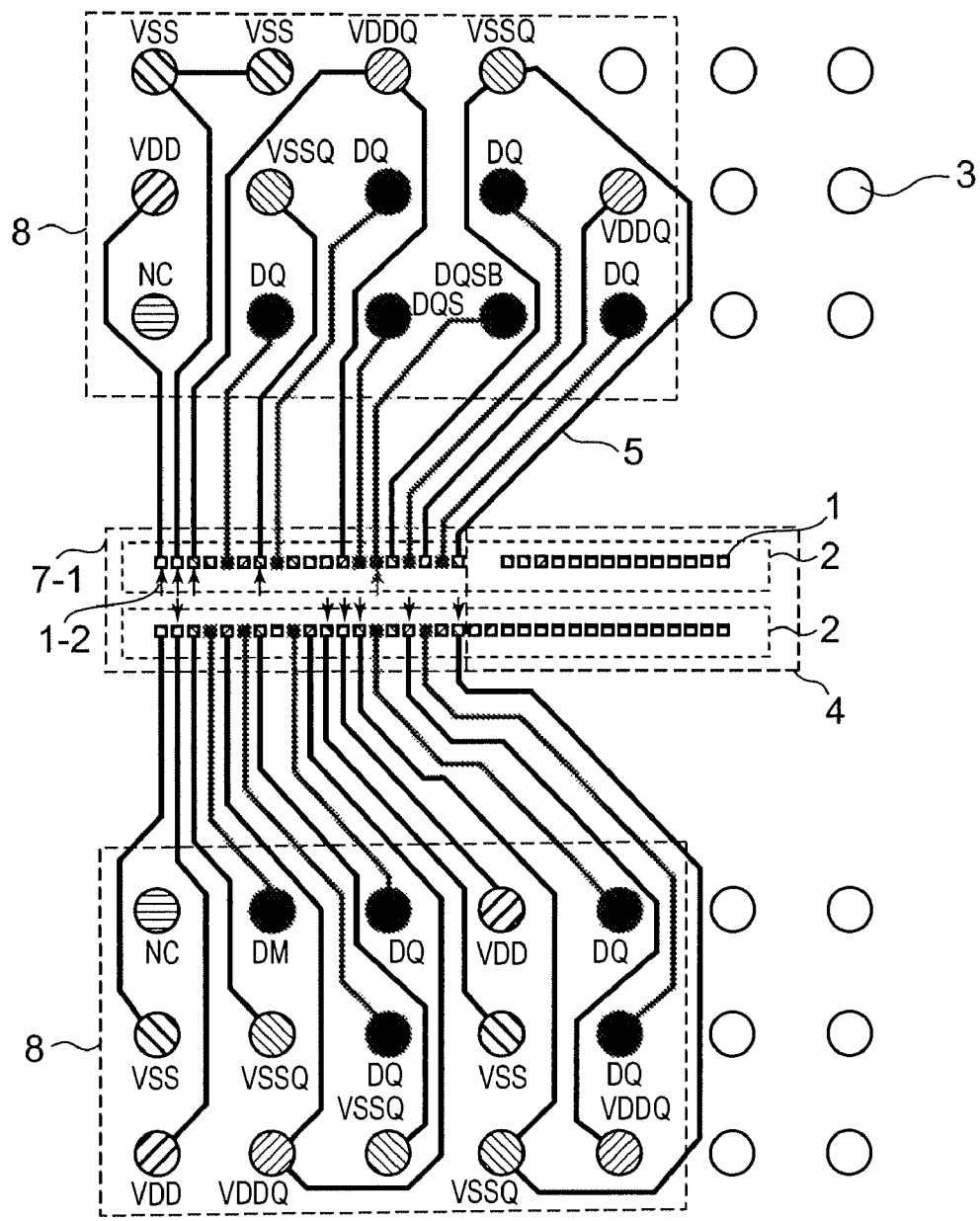
FIG. 15 is a diagram showing a pad arrangement of an 8-bit structure device having two line pads.

While this invention has thus far been described in conjunction with the preferred embodiments thereof, it will readily be possible for those skilled in the art to put this invention into practice in various other manners. For example, though the pads are arranged in a line in each embodiment, this invention is applicable to a case of the pads are arranged in two parallel lines as shown in FIG. 14 or 15.

What is claimed is:

1. A semiconductor device comprising:
a semiconductor chip usable as any one of at least a first bits structure device having a first number of DQ system pads and a second bits structure device having a second number of DQ system pads; and
a package for packaging said semiconductor chip;
wherein said semiconductor chip has first and second DQ pad groups of DQ system pads as said second number of DQ system pads for said second bits structure device, said first DQ pad group arranged in a first area at a vicinity of a middle part of a surface of said semiconductor chip and said second DQ pad group arranged in a second area at an outer side of said first area on said surface; and
wherein said first bits structure device uses said second DQ pad group except for said first DQ pad group as said first number of said DQ system pads.

2. The semiconductor device as claimed in claim 1, wherein an arrangement of all pads formed in said second area is decided on the basis of both of a pin arrangement when said package is for a 16-bit structure device and a pin arrangement when said package is for a 8-bit structure device.

3. The semiconductor device as claimed in claim 1, wherein an arrangement of all pads formed in said second area is made to bring an equivalent for an arrangement of pads included in said first DQ pad group into existence.

4. The semiconductor device as claimed in claim 1, wherein a pin arrangement of said package is based on a JEDEC standard.

5. The semiconductor device as claimed in claim 1, wherein said second area is located at one end side of said surface while said first area is located at the middle side to be adjacent to said first area.

6. The semiconductor device as claimed in claim 5, wherein pads formed in said first area and pads formed in said second area are arranged in a line.

7. The semiconductor device as claimed in claim 5, wherein pads formed in said first area and pads formed in said second area are arranged in two parallel lines, respectively and wholly.

8. The semiconductor device as claimed in claim 1, further comprising an additional pad necessary as one of DQ system pads for said first bits structure device is formed in said second area.

9. The semiconductor device as claimed in claim 1, wherein said first number is smaller than said second number.

10. The semiconductor device as claimed in claim 1, wherein said second bits structure device is a 16-bit structure device and said first bits structure device is an 8-bit structure device.

11. The semiconductor device as claimed in claim 8, wherein said additional pad is not electrically connected to said package when said semiconductor chip is said second bits structure device.

12. A semiconductor device comprising:
a semiconductor chip usable as any one of at least a first bits structure device including a first number of DQ system pads and a second bits structure including a second number of DQ system pads, the semiconductor chip including a plurality of pads arranged in a line; and
a package for packaging the semiconductor chip;
wherein the plurality of pads are divided into a first DQ pad group and a second DQ pad group;
the first bits structure device uses the second DQ pad group except for the first DQ pad group as the first number of the DQ system pads; and
the second bits structure device uses both the first and second DQ pad groups as the second number of the DQ system pads.

13. The semiconductor device according to claim 12, further comprising:
an additional pad necessary as one of the DQ system pads for the first bits structure device is included the first DQ pad group.

14. The semiconductor device according to claim 12, wherein the second bits structure device is a 16-bit structure device and the first bits structure device is an 8-bit structure device.

* * * * *